United States Patent [19]

Sato et al.

[11] Patent Number: 4,716,306

[45] Date of Patent: Dec. 29, 1987

[54] CIRCUIT FOR DETECTING VARIATION OF RESISTANCE OF A VARIABLE-RESISTANCE ELEMENT

[75] Inventors: Naoki Sato, Hachioji; Yoshihisa Kamo, Kokubunji; Yasuhiro Katoh, Tokyo; Minoru Kosuge; Shinichi Arai, both of Odawara, all of Japan

[73] Assignee: Hitachi, Ltd., Tokyo, Japan

[21] Appl. No.: 639,093

[22] Filed: Aug. 9, 1984

[30] Foreign Application Priority Data

Aug. 15, 1983 [JP] Japan ................. 58-148082
Dec. 14, 1983 [JP] Japan ................. 58-234249

[51] Int. Cl.$^4$ ............... H03K 3/01; H03K 17/90; H03K 5/22
[52] U.S. Cl. ................ 307/296 R; 307/308; 307/494
[58] Field of Search ........... 307/530, 308, 309, 359, 307/310, 311, 494, 296 R; 328/1-5

[56] References Cited

U.S. PATENT DOCUMENTS 3,622,898 11/1971 Salmon ................. 307/309
3,898,486 8/1975 Wessel et al. ........... 307/308
4,163,160 7/1979 Frazee ................. 307/309

FOREIGN PATENT DOCUMENTS 135706 6/1976 Japan .

Primary Examiner—Stanley D. Miller
Assistant Examiner—B. P. Davis
Attorney, Agent, or Firm—Antonelli, Terry & Wands

[57] ABSTRACT

A circuit for detecting the variation of resistance of a variable-resistance element comprises a pair of grounded-base transistors with their base electrodes provided with different base voltages and with their emitter electrodes connected to both terminals of the variable-resistance element so that the voltage between both terminals of the element is kept constant. The current density of the variable-resistance element does not vary when the resistance of the variable-resistance element varies, whereby the lifetime of the element can be prolonged.

18 Claims, 6 Drawing Figures

CIRCUIT FOR DETECTING VARIATION OF RESISTANCE OF A VARIABLE-RESISTANCE ELEMENT

BACKGROUND OF THE INVENTION

The present invention relates to a circuit for detecting variation of resistance of a variable-resistance element, e.g., a magneto-resistive element, which varies its resistance in response to an external factor.

Among variable-resistance elements which vary the resistance in response to an external factor such as the pressure, heat and magnetic field, there is known a magneto-resistive element. The magneto-resistive element varies its resistivity in response to the external magnetic field, and is used for the reading head of magnetic card readers, magnetic tape systems and magnetic disk systems.

In the past, variation of resistance of the magneto-resistive head is detected by a circuit such as that shown, for example, in FIG. 1 (refer to Japanese Patent Application Laid-open No. 52-135706). In FIG. 1, reference number 1 denotes a 2-terminal magneto-resistive head, and 2 denotes a sense current source. The head 1 is supplied with a current by the sense current source 2, and it varies the resistance in response to the variation of the leakage magnetic flux of a recording medium. The variation of the magnetic flux produces a high frequency signal voltage, which is conducted through a derivative voltage source 3 to a pre-amplifier 7 and amplified by it. The sense current $I_{MR}$ flowing in the head 1 is controlled by the output of the pre-amplifier 7 and a feedback circuit 9 so that the voltage across the head 1, which is the product of the sense current $I_{MR}$ and the resistance $R_{MR}$ of the head, is equal to the voltage $V_{OS}$ of the derivative voltage source 3.

In this circuit arrangement, the magneto-resistive head 1 has one terminal 9 grounded for a.c. signal components, while another terminal 8 serves as a high-impedance signal line. Therefore, the terminal 8 is more susceptible than the terminal 9 to external noises existing across the head 1, producing a differential component of noise, resulting in an impaired signal-to-noise ratio of the generated signal. In one embodiment of the above patent, the derivative voltage $V_{OS}$ is obtained as a base-to-emitter voltage $V_{BE}$ of the input transistor of the pre-amplifier 7 by biasing it with a separate emitter current, and therefore it is difficult to obtain a large $V_{OS}$.

SUMMARY OF THE INVENTION

It is an object of the present invention to provide a circuit for detecting variation of resistance of a variable-resistance element, the circuit being high noise immunity and suitable for large scale integration for broadband applications and providing a long lifetime for the variable-resistance element by maintaining the constant current density in the element.

In order to achieve the objectives, the inventive arrangement includes a pair of grounded-base transistors having different base voltages with their emitter electrodes connected across the variable-resistance element so that the voltage across the element is kept constant. On this account, even if the resistance of the variable-resistance element varies, the current density is maintained at the initial value. The variation of resistance of the magneto-resistive element due to the variation of the leakage magnetic flux of the recording medium will appear as the variation in the current flowing in the element. This variation of current causes variations in opposite polarities in the collector currents of the grounded-base transistor pair. In this case, the current is supplied from a current source with higher impedance, and therefore both terminals of the magneto-resistive element have an equal impedance, allowing differential amplification. Accordingly, the external common mode noise can be reduced and the signal-to-noise ratio of the signal can be improved.

DESCRIPTION OF THE PREFERRED EMBODIMENTS

Figure 1:
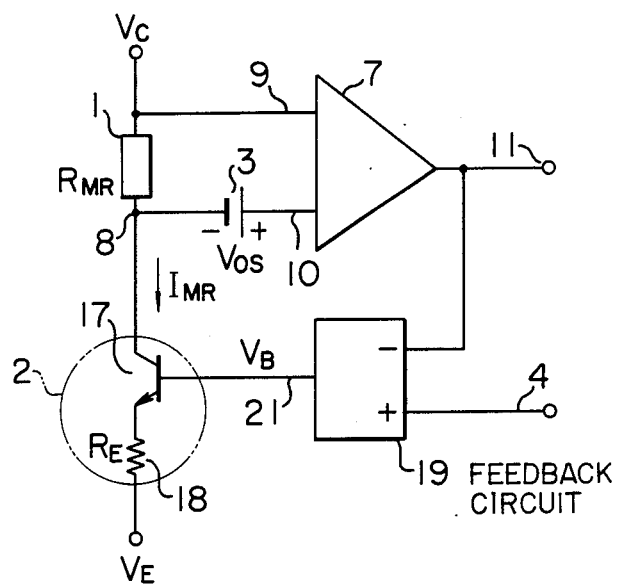
FIG. 1 is a schematic diagram of the conventional circuit for detecting the variation of resistance of a magneto-resistive element.
Figure 2:
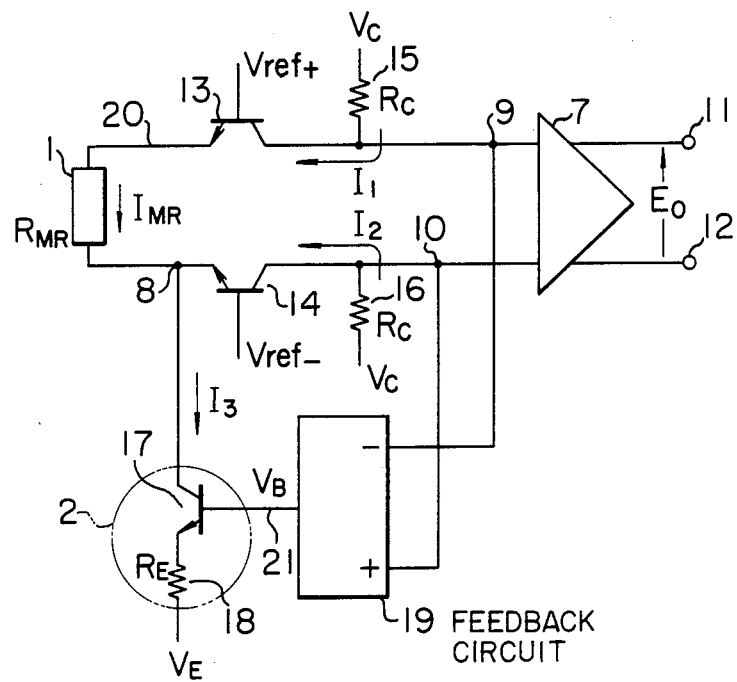
FIG. 2 is a schematic diagram showing one embodiment of the present invention.

One embodiment of the present invention will now be described with reference to FIG. 2. The arrangement of FIG. 2 includes a magneto-resistive head 1, a pair of grounded-base transistors 13 and 14, load resistors 15 and 16, a pre-amplifier 7, a current source 2 consisting of a transistor 17 and associated emitter resistor 18, and a feedback circuit 19 which controls the current source 2 by its terminal 21 so that d.c. potentials at terminals 9 and 10 are equal, and is made up, for example, of a differential amplifying circuit and a low-pass filter. The magneto-resistive head 1 has the initial resistance of $R_{MR}$ through which the current $I_{MR}$ flows, and the grounded-base transistors 13 and 14 have load resistors 15 and 16 with a resistance of $R_C$ through which collector currents $I_1$ and $I_2$ flow. The bases of the grounded-base transistors 13 and 14 are connected to voltage sources $V_{ref+}$ and $V_{ref-}$, respectively. The feedback circuit 19 has the output terminal 21 (having a voltage of $V_B$) to control the collector current $I_3$ of the current source transistor 17, and the current $I_3$ enters to the sense circuit system at a junction 8.

The following describes the operation of the foregoing circuit arrangement. The potential difference across the magneto-resistive head 1 is determined by the voltage between the emitter terminals of the transistor pair 13 and 14, and it is constant. Accordingly, the current $I_{MR}$ flowing through the magneto-resistive head 1 is equal to the collector current $I_1$ of the transistor 13 as:

$$I_{MR} = (V_{ref+} - V_{ref-})/R_{MR} = I_1 \quad (1)$$

The collector current $I_2$ of the transistor 14 is controlled by the current source 2 and feedback circuit 19 so that the input terminals 9 and 10 of the pre-amplifier 7 have no d.c. potential difference. The load resistors 15 and 16 are equally $R_C$, and in order for the collector current $I_2$ to be equal to $I_1$, the supply current $I_3$ from the current source 2 is controlled as:

$$I_3 = I_1 + I_2 = 2I_{MR} \quad (2)$$

Assuming now the resistance of the magneto-resistive head 1 has varied from $R_{MR}$ to $R_{MR}+\Delta R_{MR}$ due to the leakage magnetic flux of a recording medium, the the current of the magneto-resistive head, whose potential difference between the terminals is fixed by the emitters of transistor pair 13 and 14, varies from $I_{MR}$ to $I_{MR}+\Delta I_{MR}$, where $\Delta I_{MR}$ is as follows:

$$\Delta I_{MR} = I_{MR} \times (\Delta R_{MR}/R_{MR}) \qquad (3)$$

The supply current $I_3$ from the current source 2 is constant, and the variation of the head current appears as a variation of the collector current $I_2$ of the transistor 14 in opposite polarity, namely:

$$I_1 = I_{MR} + \Delta I_{MR} \qquad (4)$$

$$I_2 = I_{MR} - \Delta I_{MR} \qquad (5)$$

Accordingly, assuming the terminals 9 and 10 to have respective potentials $V_1$ and $V_2$, the signal voltage between the input terminals of the pre-amplifier 7 becomes:

$$|V_1 - V_2| = 2\Delta I_{MR} \times R_C \qquad (6)$$

Assuming the pre-amplifier 7 to have a gain of G, the amplitude Eo of signal at the output of the circuit is obtained from Equation (3) as:

$$Eo = |V_1 - V_2| G = (2R_C/R_{MR}) G (I_{MR} \cdot \Delta R_{MR}) \qquad (7)$$

According to this embodiment, the voltage across the magneto-resistive head is determined by the potential difference between the bases of the grounded-base transistor pair and it is constant, and on this account even if the resistance of the magneto-resistive head varies due to wear, for example, the current density in the head can be maintained constant. In addition, the signal created in the magneto-resistive head by the variation of magnetic flux from the recording medium forms a differential input to the amplifier, allowing the reduction of external common mode noises. Moreover, the feedback circuit operates to nullify the d.c. potential difference between the inputs of the pre-amplifier, eliminating the need of a capacitor for blocking a d.c. component on the signal line, and it is advantageous for integrating the whole circuit.

As is well known in the art, the arrangement of transistors 13, 14 and 17 in the parallel connection of a plurality of transistors allows the reduction of random noises created by the circuit. When this embodiment is used in high frequency applications, external common mode noises can obviously be reduced more effectively by equalizing the impedances of both terminals of the magneto-resistive head by connecting a small current source to the junction 20 or by grounding the junction 20 through a capacitor of the same capacitance as of the output capacitance of the current source 2. Although in the foregoing embodiment feedback inputs are provided at the input terminals 9 and 10 of the pre-amplifier 7, the same effect is obviously attained when the feedback from the output terminals 11 and 12 of the pre-amplifier 7 is used.

Figure 3:
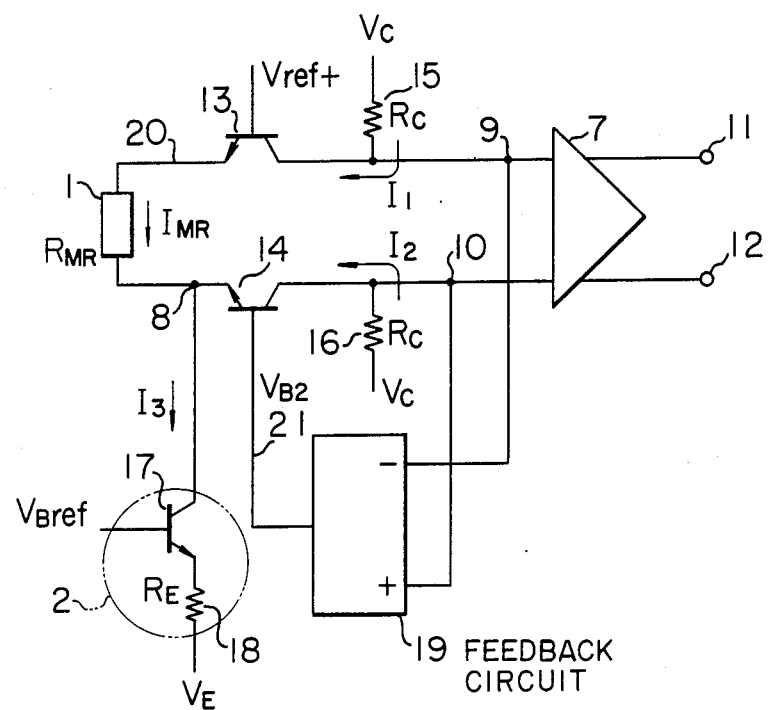
FIG. 3 is a schematic diagram showing another embodiment of the present invention.

As a modified embodiment shown in FIG. 3, the output 21 of the feedback circuit 19 may be fed back to the base of the transistor 14, while the transistor 17 is given the base voltage equal to $V_{Bref}$, and a detection circuit with a constant current source 2 for providing $2I_{MR}$ can obviously be configured. This arrangement of constant current source driving can realize a detection circuit which is highly immune to external noises.

The inventive circuit arrangement is capable of being fabricated in large scale integration operable in a wide frequency band, and is also effective for providing a long life time for the variable-resistance element. The present invention also provides a detection circuit which is highly immune to external noises.

However, in the foregoing circuit arrangements if the variable-resistance element is short-circuited, one of the grounded-base transistors forming a feedback loop is cut off. This raises a positive d.c. feedback, bringing a sharp rise of current to another grounded-base transistor, that results in the saturation or possibly breakdown of that transistor.

In order to prevent such problems, a circuit for detecting the collector voltage of the grounded-base transistor supplying a current to the variable-resistance element at a level before entering saturation, and a circuit for cutting off the current source upon detection of the critical collector voltage level are additionally provided. These additional circuits prevent the saturation of transistor when the variable-resistance element is short-circuited and also reduces the heating of the variable-resistance element by conducting the current only during the detection of resistance variation. The protection circuit retains the characteristics of the resistance variation detection circuit shown in FIG. 2 in the normal state, while in the event of a short-circuit in the variable-resistance element, it prevents the transistor from being saturated and at the same time cuts off the current source for the variable-resistance element. Namely, the increase of current due to positive feedback can be prevented by cutting the feedback loop, and by making the current source switching circuit controllable by an external signal, the magneto-resistive head can be activated only during the read mode.

Figure 4:
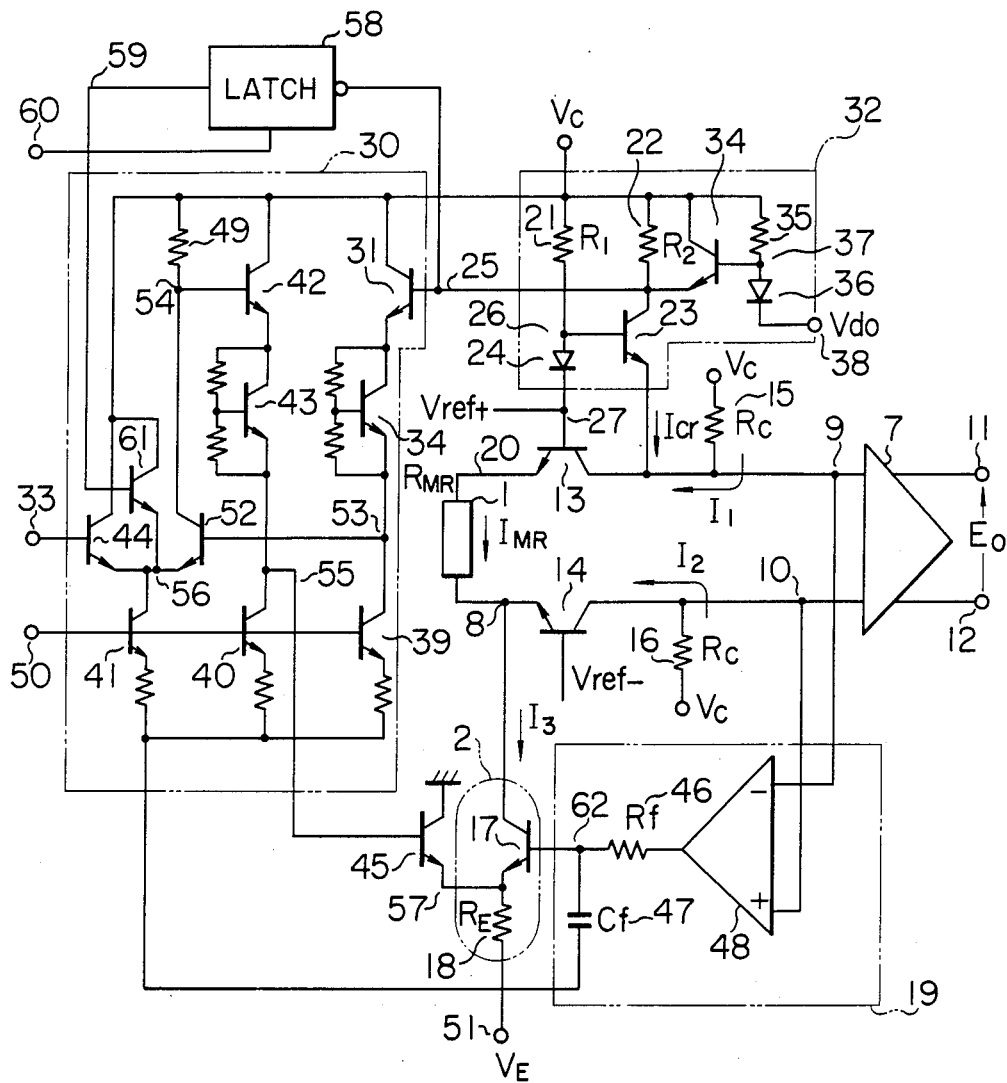
FIG. 4 is a schematic diagram showing still another embodiment of the present invention.

FIG. 4 shows the details of the protection circuit. The counterparts of FIGS. 2 and 4 are given the common reference numbers, and explanation thereof will be omitted. The arrangement of FIG. 4 includes a clamp circuit 32 which prevents the saturation of transistor 13 upon detection of a certain collector voltage when a short-circuit occurs in the magneto-resistive head 1. The clamp circuit 32 consists of a clamping transistor 23, a biasing resistor 21 and diode 24 for determining the clamp voltage, and a clamp mode detector made up of a transistor 34, resistors 22 and 35, and a diode 36. In this arrangement, the voltage level to be detected as abnormality is $V_{ref+}$.

In operation, if the current $I_1$ flowing in the transistor 13 increases by some reason, causing the collector voltage to fall below $V_{ref+}$, the transistor 23 starts operating to conduct a current $I_{cr}$. When the voltage at terminal 25 falls and becomes substantially equal to voltage $V_{do}$ at terminal 38, the clamping operation is indicated to the control circuit 30. The control circuit 30 raises the voltage at output terminal 55 to bring the transistor 45 into a conductive state so that the transistor 17, i.e., the current source 2, is cut off. The control circuit 30 is made up of a current which consisting of emitter followers 31 and 42, level shift circuits 34 and 43, and transistors 44, 52 and 61, and three current sources, and the circuit principally constitutes an inverting amplifier having an input terminal 25 and an output terminal 55. When the current source 2 has been cut off, causing the clamp circuit to quit operating, the control circuit 30 operates to activate the current source 2 again. But, this is prevented by the provision of a latch circuit 58, and the current source 2 is kept cut off. The latch circuit 58 has a reset terminal 60, through which a reset input activates the current source 2 again. An external input terminal 33 is provided, by which the current is conducted to the magneto-resistive head only during the read mode.

Figure 5:
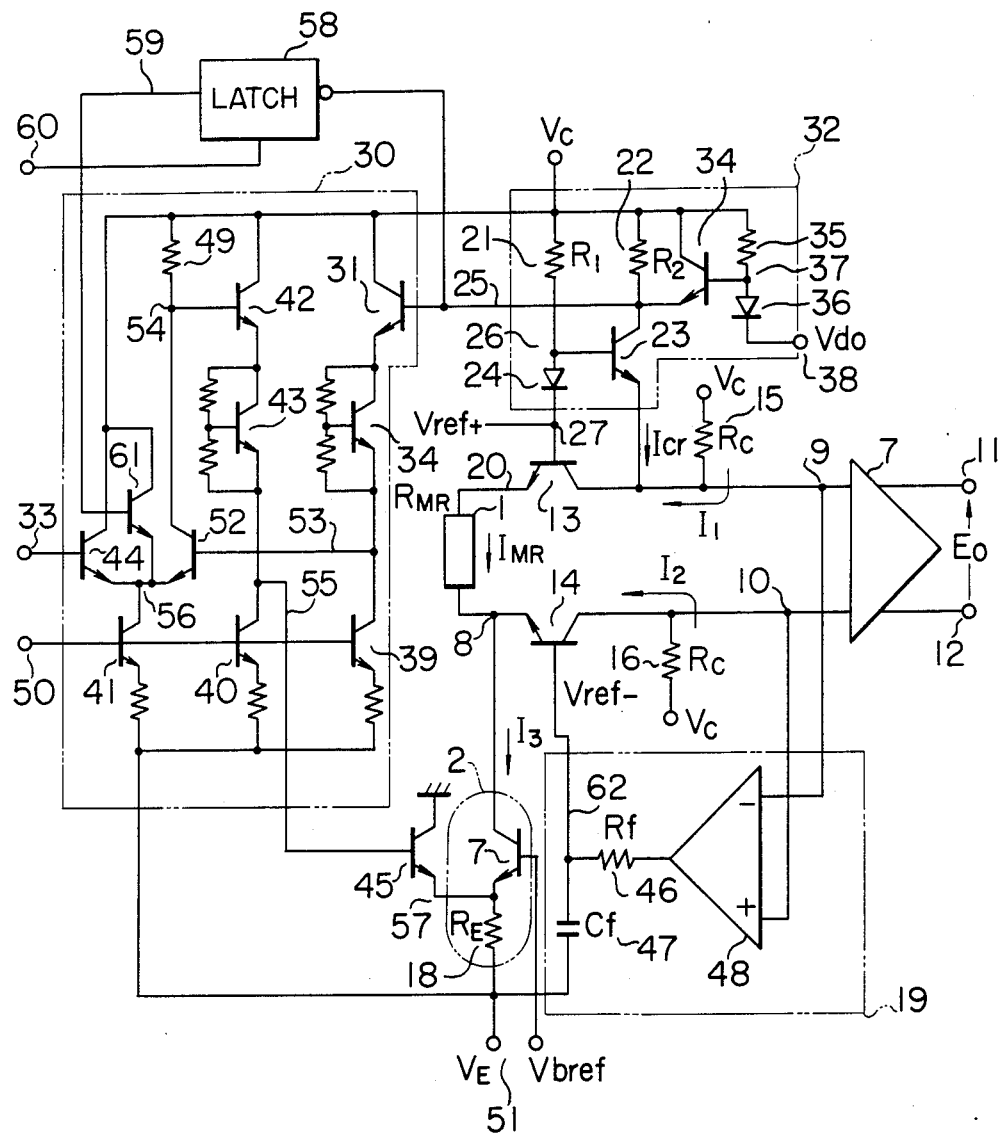
FIG. 5 is a schematic diagram showing further embodiment of the present invention.

FIG. 5 shows another embodiment of the present invention, where the differential-type resistance variation detection circuit drives the magneto-resistive head by a constant current. In this arrangement, the output terminal 62 of the feedback circuit 19 in the embodiment of FIG. 4 is connected to the base of the transistor 14, so that the base voltage of the transistor 7 in the current source 2 functions as the terminal ($V_{bref}$) for determining the current $I_{MR}$ flowing in the magneto-resistive head 1. In this case, for the output current $I_3$ of the current source 2, the head current $I_{MR}$ obviously becomes:

$$I_{MR} = I_3/2$$

Figure 6:
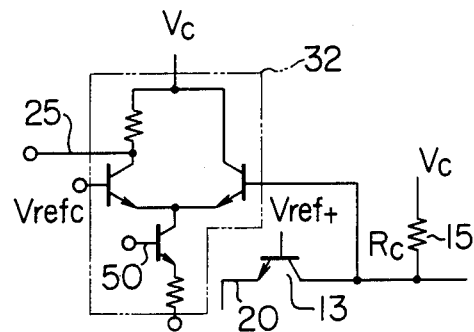
FIG. 6 is a schematic diagram showing the voltage detection circuit according to the present invention.

The voltage detection circuit 32 may alternatively be configured using a comparator as shown in FIG. 6.

As described above, the use of the inventive protection circuit and control circuit prevents the saturation and breakdown of circuit components due to a short-circuit in the variable-resistance element. The inventive arrangement also facilitates the control of current conduction to the variable-resistance element.

We claim:

1. A circuit for detecting variation of resistance of a variable-resistance element which is supplied with a bias current and varies the resistance thereof in response to an external factor, said circuit comprising:
    first means for applying a constant d.c. voltage across said variable-resistance element;
    a current source connected to one of two terminals of said variable-resistance element to supply said bias current;
    second means for detecting the variation of said bias current which flows in said variable-resistance element depending on said external factor; and
    a feedback circuit for controlling said first means in accordance with the input signal or output signal of said second means,
    wherein said first means comprises a pair of grounded-base transistors with their base electrodes being provided with different base voltages, with their emitter electrodes being respectively connected to said two terminals of said variable-resistance element, and with their collector electrodes being connected to the inputs of said second means.

2. A resistance variation detecting circuit according to claim 1, wherein said first means includes means for establishing substantially equal impedance at said two terminals of said variable-resistance element.

3. A circuit for detecting variation of resistance of a variable-resistance element which is supplied with a bias current and varies the resistance thereof in response to an external factor, said circuit comprising:
    first means for applying a constant d.c. voltage across said variable-resistance element;
    a current source connected to one of two terminals of said variable-resistance element to supply said bias current; and
    second means for detecting the variation of said bias current which flows in said variable-resistance element depending on said external factor,
    wherein said first means comprises a pair of grounded-base transistors with their base electrodes being provided with different base voltages, with their emitter electrodes being respectively connected to said two terminals of said variable-resistance element, and with their collector electrodes being connected to the inputs of said second means,
    said circuit further comprising detection means for detecting the voltage of said collector electrodes and control means for controlling said current source in accordance with the output signal of said detection means.

4. A resistance variation detecting circuit according to claim 3, wherein said detection means provides a signal to said control means when the voltage across said collector electrodes reaches a predetermined value.

5. A resistance variation detecting circuit according to claim 4 further comprising means for holding or cancelling the control state of said current source.

6. A resistance variation detecting circuit according to claim 5, wherein said current source is operable to cancel the control state by an external signal.

7. A circuit for detecting variation of resistance of a variable-resistance element which is supplied with a bias current and varies the resistance thereof in response to an external factor, said circuit comprising:
    first means for applying a constant d.c. voltage across said variable-resistance element;
    a current source connected to one of two terminals of sadi variable-resistance element to supply said bias current; and
    second means for detecting the variation of said bias current which flows in said variable-resistance element depending on said external factor,
    wherein said first means comprises a pair of grounded-base transistors with their base electrodes being provided wtih different base voltages, with their emitter electrodes being respectively connected to said two terminals of said variable-resistance element, and with their collector electrodes being connected to the inputs of said second means, and
    wherein said second means comprises means for detecting the variation of said bias current by converting a current variation into a voltage variation.

8. A resistance variation detecting circuit according to claim 7 further comprising a feedback circuit which provides a control signal dependent on the input signal or output signal of said second means to said current source.

9. A resistance variation detecting circuit according to claim 7 further comprising a feedback circuit which provides a control signal dependent on the input signal or output signal of said second means to the base electrode of one of said transistor pair.

10. A circuit for detecting the variation of resistance of a variable-resistance element which is supplied with a bias current and varies the resistance thereof in response to an external factor, said circuit comprising:
    means including a pair of grounded-base transistors with their base electrodes being provided with different base voltages and with their emitter electrodes being connected to both terminals of said variable-resistance element so that the d.c. potential difference between both terminals of said element is kept constant;

a current source connected to one terminal of said variable-resistance element to supply said bias current;

load resistors having one terminals connected to the collector electrodes of said transistor pair and another terminals connected to a voltage source; and means for obtaining a differential output signal from said collector electrodes.

11. A resistance variation detecting circuit according to claim 10 further comprising detection means for detecting the potential at a collector electrode of said transistor pair and control means for controlling said current source depending on the output signal of said detection means.

12. A resistance variation detecting circuit according to claim 11, wherein said detection means provides an output signal to said control means when the potential of said collector electrode has reached a predetermined value.

13. A resistance variation detecting circuit according to claim 12 further comprising means for holding or cancelling the control state of said current source.

14. A resistance variation detecting circuit according to claim 13, wherein the control state of said current source can be cancelled by an external signal.

15. A resistance variation detecting circuit according to claim 10 further comprising a feedback circuit which provides a control signal dependent on said differential output signal to said current source.

16. A resistance variation detecting circuit according to claim 10 further comprising a feedback circuit which provides a control signal dependent on said differential output signal to the base electrode of the transistor.

17. A circuit for detecting the variation of resistance of a variable-resistance element which is supplied with a bias current and varies the resistance thereof in response to an external factor, said circuit comprising:

means including a pair of grounded-base transistors with their base electrodes being provided with different base voltages and with their emitter electrodes being connected to both terminals of said variable-resistance element so that the d.c. potential difference between both terminals of said element is kept constant;

a current source connected to one terminal of said variable-resistance element to supply said bias current;

load resistors having one terminals connected to the collector electrodes of said transistor pair and another terminals connected to a voltage source;

a differential amplifier connected to the collector terminals of said transistor pair;

a clamp circuit which maintains higher than a predetermined value the collector voltage of the transistor connected to other terminal of said variable resistance element than the terminal to which said current source is connected;

a control circuit for controlling the conduction of said current source depending on the output of said clamp circuit; and a latch circuit which holds the control state of said control circuit and cancels the control state in response to an external signal.

18. A resistance variation detecting circuit according to claim 17 further comprising a feedback circuit which provides a control signal dependent on the input signal or output signal of said differential amplifier to said current source or the base electrode of said transistor.

* * * * *